United States Patent [19]

Kitaori et al.

[11] Patent Number: 5,447,748
[45] Date of Patent: Sep. 5, 1995

[54] METHOD AND APPARATUS FOR PRODUCING MAGNETIC RECORDING MEDIUM

[75] Inventors: Noriyuki Kitaori; Osamu Yoshida; Hirohide Mizunoya; Akira Shiga, all of Tochigi, Japan

[73] Assignee: Kao Corporation, Tokyo, Japan

[21] Appl. No.: 299,102

[22] Filed: Sep. 2, 1994

[30] Foreign Application Priority Data

Sep. 30, 1993 [JP] Japan .................................. 5-244681

[51] Int. Cl.[6] .......................................... H01F 10/02
[52] U.S. Cl. ..................................... 427/130; 118/38; 118/50; 118/500; 427/131; 427/132; 427/177; 427/294; 427/349; 427/350
[58] Field of Search .............. 427/131, 132, 130, 294, 427/177, 289, 349, 350; 118/38, 50, 500, 1

Primary Examiner—Bernard Pianalto
Attorney, Agent, or Firm—Birch Stewart Kolasch & Birch

[57] ABSTRACT

There is provided an apparatus for producing a magnetic recording medium which enables a good-quality magnetic recording medium to be produced with an improved production efficiency. This apparatus comprises a back-coat layer-coating vacuum chamber, a magnetic layer-coating vacuum chamber, a lubricant layer-coating vacuum chamber and a slitting vacuum chamber provided in a housing under vacuum, wherein the back-coat layer-coating vacuum chamber includes a melting pot disposed under a substrate and containing a metal, an electron beam-emitting device, and a guiding roller for reversing the surfaces of the substrate; the magnetic layer-coating vacuum chamber includes a melting pot disposed under the substrate and containing a magnetic substance, an electron beam-emitting device, and an oxidizing gas introduction means; the lubricant layer-coating vacuum chamber includes a lubricant-providing means disposed under the substrate; and the slitting vacuum chamber includes a winding means, a slitter, and an oxidizing gas-providing means.

9 Claims, 2 Drawing Sheets

METHOD AND APPARATUS FOR PRODUCING MAGNETIC RECORDING MEDIUM

FIELD OF THE INVENTION

The present invention relates to an apparatus for producing a magnetic recording medium, and in particular relates to an apparatus capable of continuously coating a substrate with a back-coat layer, a magnetic layer and a lubricant layer in a housing under vacuum and stably slitting the substrate thus coated with these layers.

RELATED ART

Conventional magnetic recording medium includes an application-type magnetic recording medium having a magnetic layer formed through application of a magnetic coating material comprising a magnetic metallic material and binder as the main components on a non-magnetic substrate, and a vacuum deposition-type magnetic recording medium having a magnetic layer formed through vacuum deposition of a magnetic metallic substance on a non-magnetic substrate.

A vacuum-metallized tape, which is a type of the vacuum deposition-type magnetic recording medium is a tape produced through depositing on the surface of a film base the vapor of a ferromagnetic substance, examples of which include metals such as iron (Fe), nickel (Ni), and cobalt (Co); and magnetic metals such as a Co—Ni alloy, a Co—Pt alloy, a Co—Ni—Pt alloy, an Fe—Co alloy, an Fe—Ni alloy, an Fe—Co—Ni alloy, an Fe—Co—B alloy, a Co—Ni—Fe—B alloy, and a Co—Cr alloy. Since such a vacuum-metallized tape does not require a binder as in the case of an application-type tape, a thin magnetic layer having a high degree of packing can be formed to attain an improvement in high-frequency characteristics and materialization of a thinner tape.

The back-coat layer of this vacuum-metallized tape decreases in a friction coefficient of the back surface of tile tape so as to be effective, for example, in preventing the tape from being randomly wound up.

Even in the case of the vacuum-metallized tape, the back-coat layer thereof is formed through application of a coating material comprising a metallic powder, a binder resin and a small amount of additives according to conventional technology. If application of the back-coat layer is followed by vacuum deposition of the magnetic layer in the above-mentioned case, degassing from the back-coat layer (gas evolution from the binder resin) occurs in a housing under vacuum which lowers the degree of vacuum and results in unsatisfactory vacuum deposition.

According to conventional technology, therefore, vacuum deposition of the magnetic layer is followed by application of the back-coat layer on the vacuum-metallized tape in the air.

As for a lubricant layer, the application-type magnetic recording medium has a lubricant in a magnetic layer formed from a magnetic coating material containing the lubricant therein, for the purpose of lowering the friction coefficient of the magnetic recording medium with respect to the recording head. On the other hand, the vacuum deposition-type magnetic recording medium has a magnetic layer and a lubricant layer (overcoat layer) formed thereon either by applying a lubricant on the magnetic layer through roller transfer or the like, or by dipping the non-magnetic substrate with the magnetic layer thereon in a solution of a lubricant, for the purpose of protecting the magnetic layer and lowering the friction coefficient of the magnetic recording medium with respect to the recording head.

As for an oxide layer, in the case of the vacuum deposition-type magnetic recording medium, a protective layer formed of an oxide, instead of the binder used in the application-type magnetic recording medium, i.e., an oxide layer, is formed on the magnetic layer to make the magnetic layer durable. According to conventional technology, the vacuum-metallized substrate is removed from a housing under vacuum after being provided with the foregoing layers, then subjected to various treatments, and subsequently sent to a slitter to be slit to a predetermined width. The slit vacuum-metallized substrate, after being cut to a predetermined size, is incorporated into, for example, cassettes to be ready as finished goods for shipment.

As for tile formation of the back-coat layer, the conventional method wherein a tape having a magnetic layer formed by vacuum deposition is taken out into the air and then coated with a back-coat layer, has tile problem in that the application of the back-coat layer entails contamination of the magnetic layer and attachment of dust to the back-coat layer, which increases the number of drop-outs in a drop-out inspection test (inspection test wherein a magnetic tape in an inspection cassette deck is subjected to recording and playback of given signals to detect dropouts, which are omissions of signals to be reproduced because of flows in the surface of the tape or foreign matter attached to the surface of the tape).

Further, although carbon contained in the back-coat layer is good in conductivity, the back-coat layer has a low conductivity because the presence of a binder in the back-coat layer lowers the antistatic effect thereof. Because the back-coat layer includes the binder as an adhesive, the binder having a low electric conductivity lowers the conductivity of the back-coat layer in entirety. A high conductivity results in antistatic effect during the running step of the tape.

Furthermore, the magnetic layer and the back-coat layer cannot be formed in sequence which results in a poor production efficiency.

As for the formation of the lubricant layer, it is difficult to homogeneously disperse a lubricant into the magnetic layer in the application-type magnetic recording medium. On the other hand, application of a lubricant on the magnetic layer of the vacuum deposition-type magnetic recording medium involves a difficulty in obtaining a lubricant layer having a uniform thickness or an even surface. In this case the lubricant does not work so much as expected. Furthermore, in the case of formation of the lubricant layer through roller transfer in the vacuum deposition-type magnetic recording medium, the non-magnetic substrate having various layers thereon must be wound up before being transported to a separate production line for formation of the lubricant layer, which results in very poor productivity.

As for the formation of the oxide layer (protective layer), since the step of slitting the vacuum-metallized substrate with a slitter is the final step of the process of producing a magnetic recording medium, the cut surfaces of the resulting product are not subjected to any treatment. Thus, the cut surfaces of the magnetic layer, formed by the slitting operation, are consequently exposed to the air, wherein it is feared that deterioration in the performance of the magnetic recording medium may begin at these cut surfaces in a short time. U.S. patent application Ser. No. 122,286 was relevantly filed on Sep. 17, 1993.

Accordingly, an object of the present invention is to provide a novel apparatus for producing a magnetic recording medium that can solve the foregoing problems of the prior art.

BRIEF DESCRIPTION OF THE DRAWINGS

In FIG. 1, numeral 1 refers to a housing under vacuum, 2 to a back-coat layer-coating vacuum chamber, 3 to a magnetic layer-coating vacuum chamber, 4 to a lubricant layer-coating vacuum chamber, 5 to a slitting vacuum chamber, 6 to a substrate, 7 to an opening for the substrate to pass through, 9 to a melting pot, 10 to an electron beam-emitting device, 11 to a metal, 12 to a substrate-driving device, 16 to a melting pot, 18 to a magnetic substance, 19 to an electron beam-emitting device, 20 to a substrate-driving device, 25 to an oxidizing gas introduction tube, 26 to a guiding roller, 27 to a substrate-driving device, 30 to a lubricant-providing device, 34 to an elastic roller, 35 to a pair of winding rollers, 36 to a slitter, and 37 to an oxidizing gas-providing tube.

DISCLOSURE OF THE INVENTION

Figure 1:
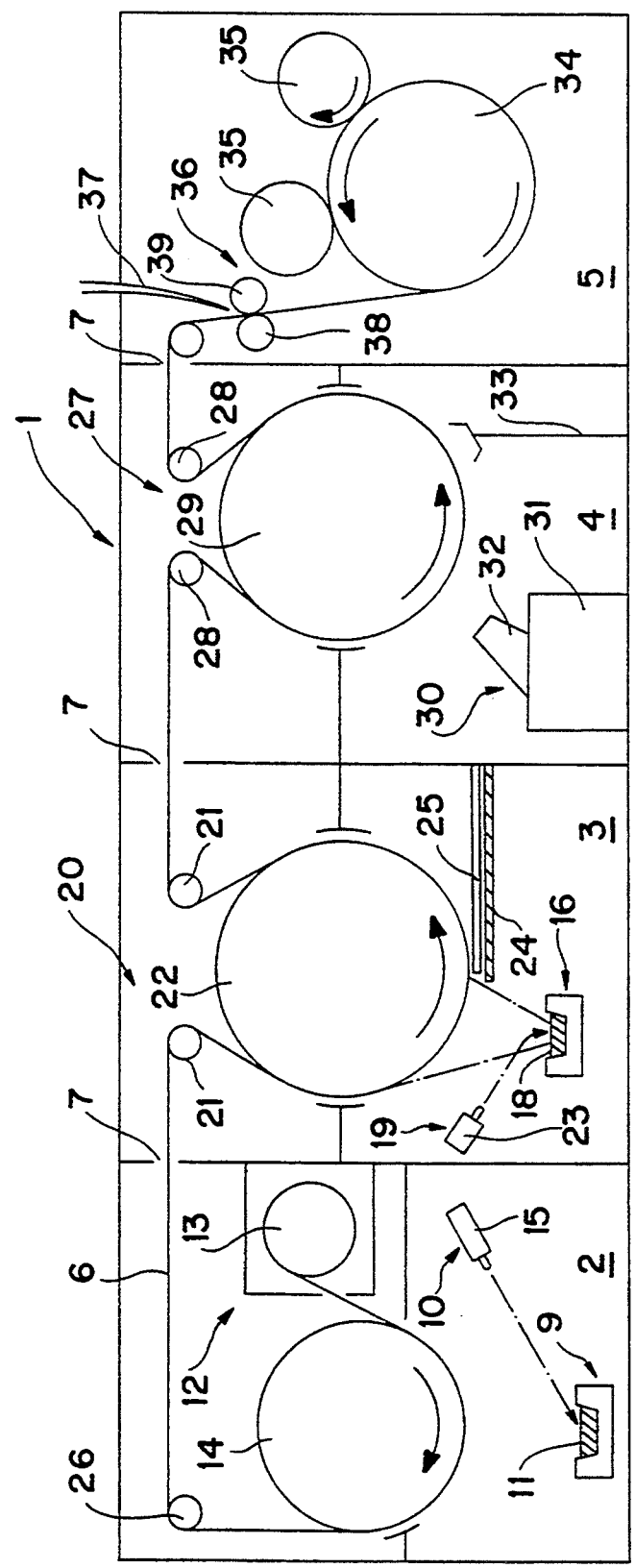
FIG. 1 is a configurational diagram of an apparatus for producing a magnetic recording medium according to the present invention.

In accordance with the present invention, there is provided an apparatus for producing a magnetic recording medium by coating a substrate with a back-coat layer, a magnetic layer and a lubricant layer under vacuum, which comprises a winding means for winding up a vacuum-metallized substrate, a slitter disposed upstream of the winding means in the running direction of the vacuum-metallized substrate for slitting the vacuum-metallized substrate under vacuum, and an oxidizing gas-providing means for providing an oxiding gas to the cut surfaces of the vacuum-metallized substrate slit with the slitter.

It is preferred that a back-coat layer-coating vacuum chamber, a magnetic layer-coating vacuum chamber, a lubricant layer-coating vacuum chamber, and a slitting vacuum chamber be provided in one housing under vacuum or a plurality of independent housings under vacuum. These chambers may be under a common vacuum. A heating means may be provided to heat the oxidizing gas to be fed to cut surfaces of the vacuum-metallized substrate.

The slitter and the oxidizing gas-providing means are disposed in such a way that the oxidizing gas is blown against the cut surfaces of the slit vacuum-metallized substrate immediately after the slitting operation to form oxide films on the cut surfaces.

The apparatus of the present invention preferably comprises a housing under vacuum, and a series of the back-coat layer-coating vacuum chamber, the magnetic layer-coating vacuum chamber, the lubricant layer-coating vacuum chamber and the slitting vacuum chamber independently provided in the housing, wherein the housing is equipped with a series of substrate-driving devices for driving and transporting a substrate therethrough and openings provided between adjacent chambers for the substrate to pass through:

wherein the back-coat layer-coating vacuum chamber includes a melting pot disposed under the substrate and containing a metal, an electron beam-emitting device for irradiating the metal in the melting pot with an electron beam, and a guiding roller for reversing the metal-deposited surface and other surface of the substrate;

wherein the magnetic layer-coating vacuum chamber includes a melting pot disposed under the substrate having the metal-deposited surface and containing a magnetic substance, an electron beam-emitting device for irradiating the magnetic substance in the melting pot with an electron beam, and an oxidizing gas introduction means disposed at the end of a vacuum deposition zone for introducing an oxidizing gas into the chamber; and wherein the lubricant layer-coating vacuum chamber includes a lubricant-providing means disposed under the vacuum-metallized substrate for providing the vacuum-metallized substrate with an atomized lubricant directed thereto.

The present invention also provides a process for producing a magnetic recording medium by coating a substrate with a back-coat layer, a magnetic layer and a lubricant layer under vacuum, which comprises slitting a vacuum-metallized substrate under vacuum at a position upstream of the following winding-up position in the running direction of the vacuum-metallized substrate, providing the cut surfaces of the slit vacuum-metallized substrate with an oxidizing gas, and winding up the slit vacuum-metallized substrate at position downstream of the slitting position.

In this process, it is preferred that the step of forming the back-coat layer, the step of forming the magnetic layer, the step of forming the lubricant layer and the step of slitting the vacuum-metallized substrate be performed independently under vacuum.

These steps may be performed under a common vacuum.

The oxidizing gas may be fed, after being heated, to the vacuum-metallized substrate.

The oxidizing gas may be blown against the cut surfaces of the slit vacuum-metallized substrate immediately after the slitting operation to form oxide films on the above-mentioned cut surfaces.

A preferred example of the apparatus for producing a magnetic recording medium according to the invention comprises a housing under vacuum, and a series of a back-coat layer-coating vacuum chamber, a magnetic layer-coating vacuum chamber, a lubricant layer-coating vacuum chamber and a slitting vacuum chamber independently provided in the housing, wherein the housing is equipped with a series of substrate-driving devices for driving and transporting a substrate therethrough and openings provided between adjacent chambers for the substrate to pass through:

wherein the back-coat layer-coating vacuum chamber includes a melting pot disposed under the substrate and containing a metal, an electron beam-emitting device for irradiating the metal in the melting pot with an electron beam, and a guiding roller for reversing the metal-deposited surface and other surface of the substrate;

wherein the magnetic layer-coating vacuum chamber includes a melting pot disposed under the substrate having the metal-deposited surface and containing a magnetic substance, an electron beam-emitting device for irradiating the magnetic substance in the melting pot with an electron beam, and an oxidizing gas introduction means disposed at the end of a vacuum deposition zone for introducing an oxidizing gas into the chamber;

wherein the lubricant layer-coating vacuum chamber includes a lubricant-providing means disposed under the vacuum-metallized substrate for providing the vacuum-metallized substrate with an atomized lubricant directed thereto; and wherein the slitting vacuum chamber includes a winding means for winding up the vacuum-metallized substrate, a slitter disposed upstream of the winding means in the running direction of the vacuum-metallized substrate, and an oxidizing gas-providing means for providing the cut surfaces of the vacuum-metallized substrate slit with the slitter with a heated oxidizing gas. A preferred embodiment of the apparatus of the present invention will now be described in detail.

According to the present invention, the back-coat layer-coating vacuum chamber, the magnetic layer-coating vacuum chamber, the lubricant layer-coating vacuum chamber and the slitting vacuum chamber are independently provided in the housing under vacuum. These chambers are equipped with a series of substrate-driving devices for driving and transporting the substrate therethrough, while openings for the substrate to pass through are provided between adjacent chambers.

The back-coat layer-coating vacuum chamber includes a vacuum deposition means for forming a back-coat layer, i.e., a melting pot for melting a metal and an electron beam-emitting device for irradiating the metal in the melting pot with an electron beam. The back-coat coating vacuum chamber further includes a guiding roller for reversing the metal-deposited surface and other surface of the substrate because the back-coat layer is on the reverse side of the substrate to which the magnetic layer is formed.

The magnetic layer-coating vacuum chamber includes a vacuum deposition means for forming a magnetic layer, i.e., a melting pot for melting a magnetic substance and an electron beam-emitting device for irradiating the magnetic substance in the melting pot with an electron beam, and further includes an oxidizing gas introduction means disposed at the end of a vacuum deposition zone for introducing an oxidizing gas into the chamber to thereby form an oxide layer as a protective layer on the magnetic layer.

The lubricant layer-coating vacuum chamber includes a lubricant-providing means disposed under the vacuum-metallized substrate for providing the vacuum-metallized substrate with an atomized lubricant directed thereto.

As for the order of arrangement of the foregoing chambers, the back-coat layer-coating vacuum chamber may be disposed first in the running direction of the substrate, followed by the magnetic layer-coating vacuum chamber and the lubricant layer-coating vacuum chamber. Alternatively, the back-coat layer-coating vacuum chamber may be disposed last in such a way that the magnetic layer-coating vacuum chamber is first, followed by the lubricant layer-coating vacuum chamber and the back-coat layer-coating vacuum chamber in the running direction of the substrate.

The lubricant-providing means for providing the vacuum-metallized substrate with the atomized lubricant directed thereto may be any of the following devices.

For example, the lubricant-providing means may comprise an ultrasonic oscillator and a spray nozzle to spray the vacuum-metallized substrate with a lubricant that is atomized by applying ultrasonic waves thereto. Alternatively, the lubricant-providing means may comprise a rotator and an open top container, wherein the vacuum-metallized substrate is sprayed with a lubricant that is atomized by bring the rotator into contact with the lubricant fed into the container.

The slitting vacuum chamber is provided with the slitter and the oxidizing gas-providing means. Slitting knives 38 and 39 cut a vacuum-metallized substrate to a predetermined width in the running direction of the substrate. The oxidizing gas-providing means is provided in such a way as to provide the cut surfaces of the magnetic layer formed in the magnetic layer-coating vacuum chamber with a heated oxidizing gas to thereby form oxide layers on the cut surfaces. Examples of the oxidizing gas include oxygen gas, ozone, steam, and air.

EXAMPLE

One example of tile present invention will now be described while referring to the accompanying drawings.

FIG. 1 is a configurational diagram of an apparatus for producing a magnetic recording medium according to the present invention. This apparatus has a housing i under vacuum, wherein a back-coat layer-coating vacuum chamber 2, a magnetic layer-coating vacuum chamber 3, a lubricant layer-coating vacuum chamber 4 and a slitting vacuum chamber 5 are independently provided. These chambers are equipped with a series of substrate-driving devices for driving and transporting a substrate, i.e., a synthetic resin substrate 6 therethrough, while openings 7 for the substrate 6 to pass through are provided between adjacent chambers.

The back-coat layer-coating vacuum chamber 2 includes a substrate-driving device 12, a melting pot 9 disposed under the substrate 6, and an electron beam-emitting device 10 for irradiating a metal 11 in the melting pot 9 with an electron beam. The substrate-driving device 12 comprises a delivery roller 13, a cooling roller 14 and a guiding roller 26. The guiding roller 26 reverses the surfaces of the substrate 6. The electron beam-emitting device 10 is equipped with an electron gun 15, from which an electron beam is emitted to irradiate the metal 11 in the melting pot 9 with the electron beam. An oxygen gas introduction tube may be provided in the back-coat layer-coating vacuum chamber to feed thereinto an oxidizing gas in the course of vacuum deposition to control the friction coefficient of the back-coat layer to secure the traveling stability of the substrate. Additionally, the corrosion resistance of the tape can also be improved by utilizing the oxidizing gas.

The magnetic layer-coating vacuum chamber 3 includes a substrate-driving device 20, a melting pot 16 disposed under the substrate 6 and on the left side of FIG. 1, an electron beam-emitting device 19 for irradiating the magnetic substance 18 in the melting pot 16 with an electron beam, and an oxidizing gas introduction tube disposed at the end of a vacuum deposition zone for feeding an oxidizing gas, i.e., an oxygen gas introduction tube 25. The substrate-driving device 20 comprises a pair of guiding rollers 21 and a cooling roller 22. The electron beam-emitting device 19 is equipped with an electron gun 23, from which an electron beam is emitted to irradiate the magnetic metallic substance 18 in the melting pot 16 with the electron beam. A barrier panel 24 regulates the vacuum deposition zone wherein the vapor of the magnetic metallic substance is to be deposited on the substrate 6. The oxygen gas introduction tube 25 is connected to an oxygen gas-feeding source not shown in FIG. 1, and has a tip located at the end of the vacuum deposition zone to form an oxide layer on the magnetic layer. The surfaces of the substrate 6 are reversed by means of the guiding rollers 26 and 21 immediately after the tape enters the magnetic layer-coating vacuum chamber 3 from the back-coat layer-coating vacuum chamber 2.

The lubricant layer-coating vacuum chamber 4 includes a substrate-driving device 27, and a lubricant-providing device 30 for providing the tape with an atomized lubricant. The driving device 27 comprises a pair of guiding rollers 28 and a heated can 29. The lubricant-providing device 30 comprises an ultrasonic atomizer 31 and a spray nozzle 32, which is disposed under the heated can 29 and on the left side of FIG. 1. The lubricant is atomized by means of ultrasonic waves, and sprayed toward the substrate 6 through the spray nozzle 32 to form a lubricant layer on the oxide layer that is on the magnetic layer. An infrared lamp 33 heats the lubricant layer to promote drying thereof and improve the bond strength of the lubricant layer to the metallic surface.

Finally, the slitting vacuum chamber 5 includes a substrate-driving device, i.e., an elastic roller 34, a winding means for winding up the substrate 6, i.e., a pair of winding reels 35, a slitter 36 disposed upstream of the winding reels 35 in the running direction of the substrate 6, and an oxidizing gas-providing means for providing the cut surfaces of the substrate 6 slit by the slitter 36 with an oxidizing gas via an oxygen gas-providing tube 37.

Figure 2:
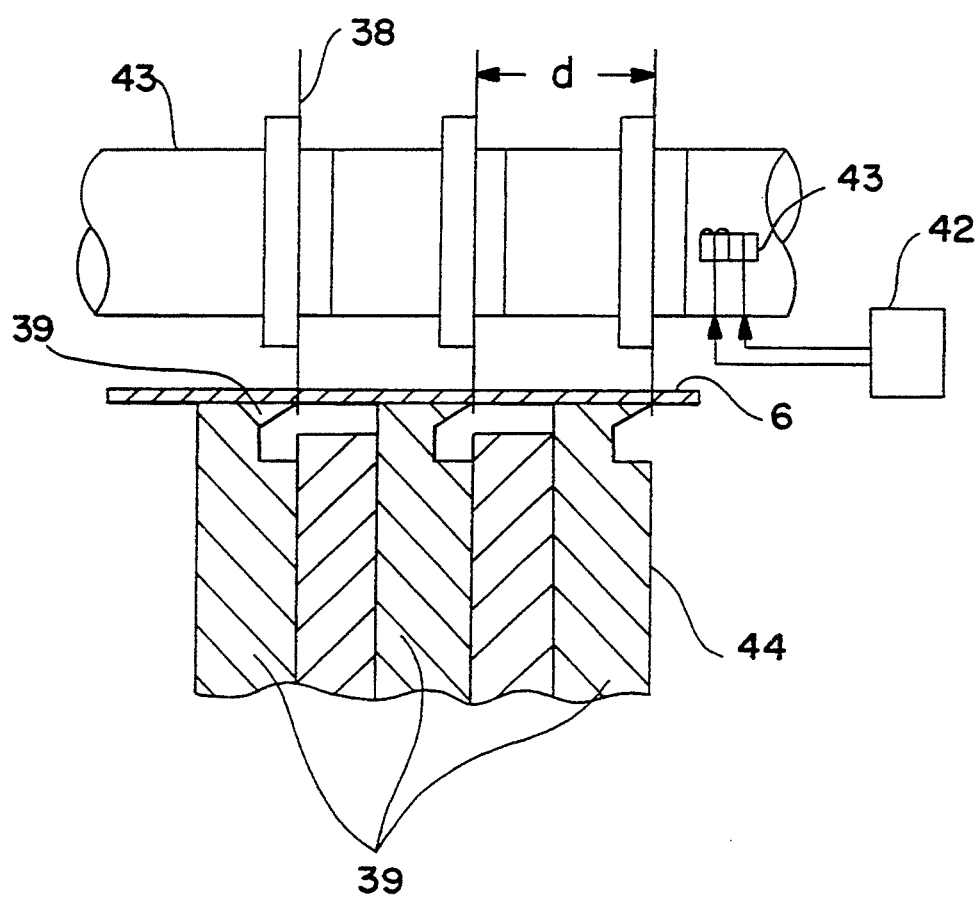
FIG. 2 illustrates an example of a slitter with knives 38 and 39.

The slitter 36 comprises left and right circular knives. A number of left knives 38 are juxtaposed at given intervals around a rotational shaft. A number of right knives 39 are also juxtaposed at given intervals around another rotational shaft like the left knives 38. The left knives 38 and the right knives 39 are revolved in mutually reverse directions via the respective rotational shafts driven by a power source, with the substrate 6 located between both series of knives to silt the substrate 6. The width d of slit substrates can be easily varied by shifting the positions of the knives. The substrate 6 is slit in the running direction thereof to a predetermined width with the slitter 36. In an example as shown in FIG. 2, upper knives and lower knives are respectively juxtaposed with the running substrate 6 located therebetween to slit the substrate 6.

A heating means 42 heats knives of the slitter via a resistance heating element 43, such as a nichrome wire. Warm water or moisture may also be used to heat the knives. Alternatively, the oxidizing gas may be pre-heated.

The substrate is slit into a plurality of slit substrates having 8 mm width by the knives 38, 39. Two winding reels 35 are in contact with the elastic roller 34 to cool the slit substrates. They are alternately divided into even-numbered ones and odd-numbered ones. These two groups of slit substrates are wound on the two reels 35, respectively.

The oxygen gas-providing tube 37 is connected to an oxygen gas-feeding source not shown in FIG. 1, and the tip of the oxygen gas-providing tube 37 is located near the slitter 36 to blow oxygen gas heated to 100° C. against the cutting edges of the knives to thereby form oxide layers on the cut surfaces of the magnetic layer.

In the apparatus having the foregoing configuration according to the present invention, the substrate 6 drawn out from the delivery roller 13 in the back-coat layer-coating vacuum chamber 2 is subjected to vacuum deposition of the vapor of the metal 11 in the back-coat layer-coating vacuum chamber 2 to form a back-coat layer on one surface of the substrate 6. Subsequently, the substrate 6 is reversed by means of the guiding roller 26, and passed through an opening 7 to the magnetic layer-coating vacuum chamber 3, wherein the vapor of the magnetic metallic substance 18 is vacuum-deposited on the other surface of the substrate 6, i.e., the surface of the substrate 6 opposite to the surface having the back-coat layer formed thereon. Further, an oxide layer is formed on the magnetic layer by introducing oxygen gas through the oxygen gas introduction tube 25. The substrate 6 having the magnetic layer and the oxide layer formed thereon is then passed through the opening 7 to enter the lubricant layer-coating vacuum chamber 4, wherein the oxide layer that is on the magnetic layer is coated with the atomized lubricant directed to the substrate 6 with the lubricant-providing device 30 to form a lubricant layer on the oxide layer that is on the magnetic layer. The substrate 6 having the back-coat layer, the magnetic layer, the oxide layer and the lubricant layer formed in this sequence finally enters the slitting vacuum chamber 5, wherein the substrate 6 is slit to a predetermined width with the slitter 36, and the resulting slit substrates are wound up around the winding reels 35. The oxygen gas-providing tube 37 feeds oxygen gas to the cut surfaces of the magnetic layers of the substrates slit with the slitter 36 to form oxide layers on the respective cut surfaces.

A film A having predetermined layers formed using cobalt as the magnetic substance and the apparatus of the present invention, and a film B having predetermined layers formed using a conventional apparatus under substantially the same conditions as in the case of the film A but slit in the air after the formation of those layers were placed into respective 8-mm cassettes, which were placed in a conditioning oven set at 60° C. and a relative humidity of 90% to carry out an accelerated deterioration test for 4 weeks, after which the saturation flux densities (Bs) of both films were compared. As a result, it was found out that the Bs retention of tile film A produced using the apparatus of the present invention was 96%, whereas that of the film B produced using the conventional apparatus was 89%. It is shown by these results that the oxide layers of the film A produced using the apparatus of the present invention function well as the protective layers, in comparison with the conventional film B.

The apparatus of the present invention exhibits the following effects as a result of the aforementioned configuration.

a) A back-coat layer, a magnetic layer, an oxide layer and a lubricant layer can be continuously formed in a common housing under vacuum. Further, a substrate having the foregoing layers thus formed can be slit in the same housing under vacuum. As a result, production equipment can be streamlined and scaled down, while a decrease in the number of production steps can be realized with an improvement in production efficiency. Furthermore, production cost can be lowered.

b) The formation in a vacuum of the back-coat layer can solve the problems of dust attachment, etc. Further, the absence of a binder in the back-coat layer eliminates a lowering of the conductivity of the back-coat layer.

c) The apparatus of the present invention enables uniform application of a lubricant as to form a lubricant layer having good surface conditions to thereby improve the travel quality of the resulting magnetic recording medium. Further, the provision of the lubricant under vacuum can prevent dust from attaching to a vacuum-metallized substrate.

d) Where a vacuum-metallized substrate is slit in the air, corrosion resistance thereof due to easy oxidation is problematic. By contrast, when a vacuum-metallized substrate is slit under vacuum while controlling the oxidizing atmosphere with the apparatus of the present invention, oxide films are formed on the cut surfaces of the slit substrate that result in an improvement in corrosion resistance.

What is claimed is:

1. An apparatus for producing a magnetic recording medium, comprising a winding means for winding up a vacuum-metallized substrate, a slitter disposed upstream of said winding means in the running direction of said vacuum-metallized substrate for slitting said vacuum-metallized substrate in a vacuum, and an oxidizing gas-providing means for providing the cut surfaces of said vacuum-metallized substrate slit by said slitter with an oxidizing gas.

2. The apparatus as claimed in claim 1, further comprising a back-coat layer-coating vacuum chamber, a magnetic layer-coating vacuum chamber, a lubricant layer-coating vacuum chamber, and a slitting vacuum chamber, which are provided in one housing and are under vacuum or in a plurality of independent housings under vacuum.

3. The apparatus as claimed in claim 1, further comprising a heating means for heating said oxidizing gas and providing said vacuum-metallized substrate with the heated oxidizing gas.

4. The apparatus as claimed in claim 1, wherein said slitter and said oxidizing gas-providing means are disposed in such a way as to blow said oxidizing gas against said cut surfaces of said slit vacuum-metallized substrate immediately after the slitting operation to form oxide films on said cut surfaces.

5. The apparatus as claimed in claim 1, further comprising at least one housing under vacuum, and a series of a back-coat layer-coating vacuum chamber, a magnetic layer-coating vacuum chamber, a lubricant layer-coating vacuum chamber and a slitting vacuum chamber independently provided in said at least one housing and equipped with a series of substrate-driving devices for driving and transporting a substrate therethrough, wherein openings are provided between adjacent chambers for passing said substrate therethrough;

wherein said back-coat layer-coating vacuum chamber includes a melting pot disposed under said substrate and containing a metal, an electron beam-emitting device for irradiating said metal in said melting pot with an electron beam, and a guiding roller for reversing the metal-deposited surface and other surface of said substrate;

wherein said magnetic layer-coating vacuum chamber includes a melting pot disposed under said substrate having said metal-deposited surface and containing a magnetic substance, an electron beam-emitting device for irradiating said magnetic substance in said melting pot with an electron beam, and an oxidizing gas introduction means disposed at the end of a vacuum deposition zone for introducing an oxidizing gas into said chamber; and wherein said lubricant layer-coating vacuum chamber includes a lubricant-providing means disposed under said substrate for providing said substrate with an atomized lubricant directed thereto.

6. A process for producing a magnetic recording medium comprising the steps of coating a vacuum-metallized substrate with a back-coat layer, a magnetic layer and a lubricant layer under vacuum, slitting the coated vacuum-metallized substrate under vacuum, providing the cut surfaces of said slit vacuum-metallized substrate with an oxidizing gas, and winding up said slit vacuum-metallized substrate at a position downstream of the slitting position.

7. The process as claimed in claim 6, wherein the step of forming a back-coat layer, the step of forming a magnetic layer, the step of forming a lubricant layer and the step of slitting said vacuum-metallized substrate are independently performed under vacuum.

8. The process as claimed in claim 6, wherein said oxidizing gas is heated and then fed to said slit vacuum-metallized substrate.

9. The process as claimed in claim 6, wherein said oxidizing gas is blown against said cut surfaces of said slit vacuum-metallized substrate immediately after the slitting operation to form oxide films on said cut surfaces.

* * * * *